United States Patent
Borodulin et al.

(10) Patent No.: US 10,490,374 B2
(45) Date of Patent: Nov. 26, 2019

(54) PHASE-CHANGE MATERIAL DISTRIBUTED SWITCH SYSTEMS

(71) Applicants: Pavel Borodulin, Baltimore, MD (US); Nabil Abdel-Meguid El-Hinnawy, Columbia, MD (US); Robert Miles Young, Ellicott City, MD (US); Matthew Russell King, Linthicum, MD (US); Michael J. Lee, Linthicum, MD (US)

(72) Inventors: Pavel Borodulin, Baltimore, MD (US); Nabil Abdel-Meguid El-Hinnawy, Columbia, MD (US); Robert Miles Young, Ellicott City, MD (US); Matthew Russell King, Linthicum, MD (US); Michael J. Lee, Linthicum, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 319 days.

(21) Appl. No.: 14/485,211

(22) Filed: Sep. 12, 2014

(65) Prior Publication Data

US 2016/0079019 A1    Mar. 17, 2016

(51) Int. Cl.
*H01H 37/46* (2006.01)
*H01L 45/00* (2006.01)
(Continued)

(52) U.S. Cl.
CPC .......... *H01H 37/46* (2013.01); *H01L 45/06* (2013.01); *H01L 45/1206* (2013.01);
(Continued)

(58) Field of Classification Search
CPC ...... H01H 85/12; H01H 87/00; H01H 37/323; H01H 37/34; H01H 37/46; H01H 37/72;
(Continued)

(56) References Cited

U.S. PATENT DOCUMENTS

| | | | | |
|---|---|---|---|---|
| 4,814,853 A | * | 3/1989 | Uchida | H01L 23/5252 257/530 |
| 5,614,440 A | * | 3/1997 | Bezama | H01L 23/5256 148/DIG. 55 |

(Continued)

FOREIGN PATENT DOCUMENTS

| | | |
|---|---|---|
| EP | 1162683 A2 | 12/2001 |
| EP | 1162683 B1 | 12/2001 |

(Continued)

OTHER PUBLICATIONS

Wen, et al.: "A Phase-Change Via-Reconfigurable On-Chip Inductor", IEEE 2010, IEDM10-237 thru IEDM10-240.
(Continued)

*Primary Examiner* — Jacob R Crum
(74) *Attorney, Agent, or Firm* — Tarolli, Sundheim, Covell & Tummino LLP

(57) ABSTRACT

One embodiment of the invention includes a phase-change material switch. The switch includes a first terminal that receives an input signal and a second terminal. The switch includes an actuation portion that receives a control signal in one of a first state to emit a first heat profile and a second state to emit a second heat profile. The switch further includes a switch portion comprising a phase-change material arranged as a plurality of longitudinal strips that each interconnect the first terminal and the second terminal and that are each in proximity with the actuation portion. The phase-change material can be selectable between a conducting state in response to the first heat profile to conduct an input signal from the first terminal to the second terminal
(Continued)

and a blocking state in response to the second heat profile to block the input signal from the first terminal to the second terminal.

14 Claims, 6 Drawing Sheets

(51) Int. Cl.
  *H01P 1/12* (2006.01)
  *H01P 1/18* (2006.01)
(52) U.S. Cl.
  CPC ........ *H01L 45/1286* (2013.01); *H01L 45/144* (2013.01); *H01P 1/127* (2013.01); *H01P 1/184* (2013.01)
(58) Field of Classification Search
  CPC .......... H01H 2037/008; H01L 45/1206; H01L 45/1286; H01L 45/128; H01L 45/06; H01L 45/144; H01P 1/127; H01P 1/184
  USPC ....................................................... 337/396
  See application file for complete search history.

(56) References Cited

U.S. PATENT DOCUMENTS

| | | | |
|---|---|---|---|
| 6,448,576 B1 | 9/2002 | Davis et al. | |
| 6,828,884 B2 | 12/2004 | Wyeth et al. | |
| 7,608,851 B2 | 10/2009 | Chen et al. | |
| 7,634,248 B2 | 12/2009 | Xu et al. | |
| 7,880,194 B2 | 2/2011 | Breitwisch et al. | |
| 9,196,585 B2* | 11/2015 | Katakura ............ H01L 23/5256 | |
| 2002/0175741 A1* | 11/2002 | Sher ..................... H01L 23/525 | |
| | | | 327/525 |
| 2007/0235784 A1 | 10/2007 | Krusin-Elbaum et al. | |
| 2008/0029753 A1 | 2/2008 | Xu et al. | |
| 2008/0285335 A1* | 11/2008 | Elmegreen .......... G11C 11/5678 | |
| | | | 365/163 |
| 2010/0188892 A1* | 7/2010 | Baks ................. G11C 13/0004 | |
| | | | 365/163 |
| 2010/0327247 A1 | 12/2010 | Ward et al. | |

FOREIGN PATENT DOCUMENTS

| | | |
|---|---|---|
| JP | 2005244831 A | 9/2005 |
| JP | 2006173555 A | 6/2006 |
| WO | WO 2007/030483 A2 | 3/2007 |
| WO | WO 2009/001262 A1 | 12/2008 |

OTHER PUBLICATIONS

International Search Report for Application No. PCT/US2015/046567 dated Oct. 29, 2015.
El-Hinnay Nabil et al: "Low-loss latching microwave switch using thermally pulsed non-volatile chalcogenide phase change materials" Applied Physics Letters, American Institute of Physics, 2 Huntington Quadrangle, Melville, NY 11747, vol. 105, No. 1, Jul. 7, 2014.
TW Search Report for corresponding TW 104128154, dated Dec. 20, 2016; Also attached is a translation of the Search Report.
Search Report for corresponding Taiwan Patent Application No. 104128154; completed May 16, 2017 and dated May 19, 2017.
Shim, et al.: "RF switches using phase change materials," 2013 IEEE 26th International Conference on Micro Electro Mechanical Systems (MEMS), Taipei, 2013, pp. 237-240.
Office Action for corresponding European application No. 15 757 416.1, dated Feb. 7, 2018.
Shim, Y. et al., "RF Switches Using Phase Change Materials." MEMS 2013. Figure 1.
Japanese Office Action corresponding to Japanese Patent Application No. 2017-513535, dated Mar. 20, 2018.
Korean Office Action corresponding to Korean Patent Application No. 10-2017-7006907, dated Apr. 9, 2018, pp. 1-4.
Written Opinion for corresponding SG11201702190X, dated Oct. 4, 2017.
Hayden, et al.: "Semiconductor Nanowire Devices"; NanoToday, Oct. 31, 2008, vol. 3, No. 5-6, pp. 12-22; found on the internet at: http://www.sciencedirect.com/science/article/pii/S1748013208700616?via%3Dihub.
Fahad, et al.: "Are Nanotube Architectures More Advantageous than Nanowire Architectures for Field Effect Transistors?"; Scientific Reports, Jun. 27, 2012, vol. 2, No. 475, pp. 1-7; found on the internet at: https://www.nature.com/articles/srep00475.
El-Hinnawy, et al.: "Low-loss Latching Microwave Switch Using Thermally Pulsed Non-volatile Chalcogenide Phase Change Materials"; Appl. Phys. Lett. 105, 013501 (2014) doi: 10.1063/1.4885388; Can be found on the internet at: http://aip.scitation.org/doi/10.1063/1.4885388.
IPOS Written Opinion for corresponding TW 11201702190X, dated Sep. 7, 2017.
Second Written Opinion for corresponding SG11201702190X, dated Sep. 28, 2018.
Wen, et al., "A Phase-Change Via-Reconfidurable On-Chip Inductor", IEEE 2010, IEDM10-237 thru IEDM10-240.
Bolton:"Mobile Device RF Front-End TAM Analysis and Forecast", CS MANTECH Conference, May 16-19, 2011, Palm Springs, CA, USA, pp. 1-4.
Wang, et al,. "Directly heated four-terminal phase change switches", 2014 IEEE MTT-S International microwave Symposium (IMS2014), Tampa, FL, 2014, pp. 1-4.
N.El-Hinnawy, et al. "Substrate Agnostic Monolithic Integration of the Inline Phase-Change Switch Technology" 2016.

* cited by examiner

PHASE-CHANGE MATERIAL DISTRIBUTED SWITCH SYSTEMS

TECHNICAL FIELD

This disclosure relates generally to electronic systems, and specifically to phase-change material distributed switch systems.

BACKGROUND

Switching devices are implemented for a variety of reasons and in a variety of applications. For example, switching devices can be implemented for logic circuit and computing applications, for radio-frequency (RF) signal switching in front-end receiver systems, for RF transmitter systems, or a variety of other applications. Transistor technology has advanced considerably with respect to reduction of size and increase in efficiency. However, transistor switching circuits can still exhibit signal losses from switching and interconnects, can still occupy a sizeable space on a printed circuit board (PCB), and can still consume significant power in maintaining activation of the switches for a given switching configuration. Other switching devices can implement micro-electromechanical systems (MEMS) switches. However, MEMS processing can be expensive and difficult, can require specialized packaging constraints, and can still exhibit switching losses and activation power consumption.

SUMMARY

One embodiment of the invention includes a phase-change material switch. The switch includes a first terminal configured to receive an input signal and a second terminal. The switch includes an actuation portion configured to receive a control signal in one of a first state to emit a first heat profile and a second state to emit a second heat profile. The switch further includes a switch portion comprising a phase-change material arranged as a plurality of longitudinal strips that each interconnect the first terminal and the second terminal and that are each in proximity with the actuation portion. The phase-change material can be selectable between a conducting state in response to the first heat profile to conduct an input signal from the first terminal to the second terminal and a blocking state in response to the second heat profile to substantially block the input signal from the first terminal to the second terminal.

Another example includes a phase-change material switch. The switch includes a first terminal configured to receive an input signal and a second terminal. The switch also includes an actuation portion comprising a pair of actuation terminals configured to receive a control signal and a conductive strip that extends between the pair of actuation terminals. The conductive strip includes a central portion having a cross-sectional dimension that is less than a dimension of the pair of actuation terminals and a pair of tapered portions that each have a cross-sectional dimension that increases from the cross-sectional dimension of the central portion to a maximum cross-sectional dimension at a respective coupling to the pair of actuation terminals. The control signal can be provided in one of a first state to emit a first heat profile and a second state to emit a second heat profile. The switch further includes a switch portion comprising a phase-change material in proximity with the central portion of the conductive strip. The phase-change material can be selectable between a conducting state in response to the first heat profile to conduct an input signal from the first terminal to the second terminal and a blocking state in response to the second heat profile to substantially block the input signal from the first terminal to the second terminal.

Another example includes a distributed switch system. The distributed switch system includes a plurality of phase-change material switches that are arranged in one of parallel, series, and a combination of parallel and series with respect to each other. Each of the plurality of phase-change material switches includes a first terminal configured to receive an input signal and a second terminal. Each of the phase-change material switches also includes an actuation portion configured to receive a control signal in one of a first state to emit a first heat profile and a second state to emit a second heat profile. Each of the phase-change material switches further includes a switch portion comprising a phase-change material in proximity with the actuation portion. The phase-change material can be selectable between a conducting state in response to the first heat profile to conduct an input signal from the first terminal to the second terminal and a blocking state in response to the second heat profile to substantially block the input signal from the first terminal to the second terminal.

DETAILED DESCRIPTION

Figure 1:
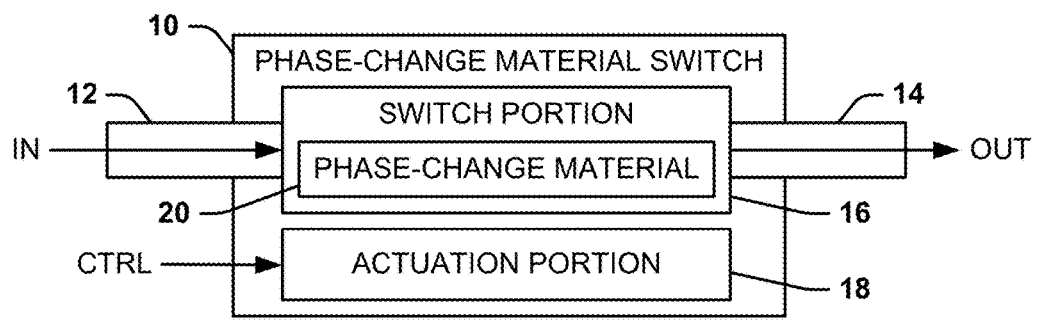
FIG. 1 illustrates an example of a phase-change material switch.

This disclosure relates generally to electronic systems, and specifically to phase-change material distributed switch systems. A phase-change material switch can include an actuation portion and a switch portion that are proximal to each other. The actuation portion can be configured to receive a control signal (e.g., control signal pulses) that can generate a heat profile from the actuation portion to the switch portion based on a state of the control signal. As an example, the actuation portion can include a pair of actuation terminals to which the control signal is applied and a conductive portion that interconnects the pair of actuation terminals. For example, the control signal can be provided to the terminals in a first state (e.g., having a low power, longer pulse width) to provide a first heat profile from the conductive strip of the actuation portion, and can be provided in a second state (e.g., having a high power, shorter pulse width) to provide a second heat profile from the conductive strip. The heat profile provided from the conductive strip can set a phase-change material in the switch portion to one of a conducting state and a blocking state, such as based on crystallizing the phase-change material to crystalline state or melting then freezing the phase-change material to an amorphous state, respectively. Therefore, an input signal that is provided to the switch portion can either be conducted or substantially blocked based on the state of the switch portion. The operation of the phase-change of the phase-change material in response to the heat profile provided from the conductive strip based on the control pulses is described in U.S. patent application Ser. No. 13/803,385 entitled "Phase-Change Material Reconfigurable Circuits", which is incorporated herein by reference in its entirety.

The phase-change material switch can be configured in a variety of ways. As an example, the phase-change material can be arranged as a plurality of longitudinal strips that each interconnect the first terminal and the second terminal and that are each in proximity with the actuation portion (e.g., the conductive strip). For example, the longitudinal strips of the phase-change material can be arranged parallel and spaced apart from each other and extend longitudinally to interconnect the first terminal and the second terminal, and can have, for example, a cross-sectional dimension that is between approximately 50 nm to approximately 10 µm. As a result, the phase-change material can be better constrained (e.g., within a dielectric) to substantially increase a longevity of the phase-change material switch in response to thermal expansion/contraction of the phase-change material. Additionally, the gaps between the longitudinal strips can be affected by the heat profile of the actuation portion, such as to reduce a voltage of the control signal necessary to change the state of the phase-change material between the conducting state and the blocking state.

As another example, the conductive strip can be arranged as tapered at the ends where the pair of terminals are coupled to the conductive strip. For example, the conductive strip can have a central portion having a cross-sectional dimension that is less than a cross-sectional dimension of the pair of terminals. The conductive strip can also include a pair of tapered portions that each have a cross-sectional dimension that increases from the cross-sectional dimension of the central portion to a maximum cross-sectional dimension at a respective coupling to the pair of terminals. The tapering of the conductive strip can provide for a more uniform temperature distribution along the longitudinal dimension of the strip during ohmic heating of the strip by the actuation pulse energy. Tapering the conductive strip can lower the current density, as well as the temperature of the area between the central portion and the contact terminals, which can typically become hotter than is necessary to transform the phase-change portion that is in close proximity to the central portion of the strip due to the lack of phase-change material in close proximity to the tapered section to absorb the heat. The uniform temperature profile that results from tapering of the heater lowers the maximum temperature that is attained along the heater during application of the actuation pulses, and as a result, the longevity of the phase-change switch can be substantially increased based on mitigating the degree of temperature-induced damage of the conductive strip.

Furthermore, the phase-change material switch can be one of a plurality of phase-change material switches in a distributed switch system. As an example, the phase-change material switches can be arranged in series, parallel, or in a combination of series and parallel, and can be controlled by a single control signal. As an example, the distributed switch system can include series-connected phase-change material switches, such that the phase-change materials in each of the series-connected phase-change material switches can switch concurrently in response to the control signal. As another example, the input signal can be provided via a signal line to a distributed switch system that includes parallel-connected phase-change material switches. The signal line can be branched to provide the input signal to an input terminal of each of the parallel-connected phase-change material switches to provide the input signal through each of the parallel-connected phase-change material switches concurrently. As a result, the distributed switch system can have varying switching voltages, switching currents, and/or parasitic capacitances relative to individual phase-change material switches.

FIG. 1 illustrates an example of an example of a phase-change material switch 10. The phase-change material switch 10 can be implemented in any of a variety of applications that require one or more switches that can be opened or closed to pass or block a signal. For example, the phase-change material switch 10 can be implemented in logic circuits and computing applications, radio-frequency (RF) signal switching in front-end receiver systems, in transmitter systems, or in an arbitrary reconfigurable RF circuit, such as an RF field-programmable gate array (FPGA). As an example, the phase-change material switch 10 can be fabricated, at least in part, based on or similar to the fabrication techniques described in U.S. patent application Ser. No. 13/828,351 titled "Phase-Change Material Switch and Method of Making the Same", which is incorporated herein by reference in its entirety.

In the example of FIG. 1, the phase-change material switch 10 includes an input terminal 12 that receives an input signal IN, and includes an output terminal 14 that can provide the input signal IN as an output signal OUT in a conducting state of the phase-change material switch 10, such that the phase-change material switch 10 acts substantially as a short-circuit, or can block the input signal IN from being provided as the output signal OUT in a blocking state of the phase-change material switch 10, such that the phase-change material switch 10 acts substantially as an open-circuit. As an example, the input signal IN can be provided as a radio frequency (RF) signal.

The phase-change material switch 10 includes a switch portion 16 and an actuation portion 18. The switch portion 16 includes a phase-change material 20 that can allow the switch portion 16, and thus the phase-change material switch 10, to be set to the conducting state or the blocking state. As described herein, a phase-change material (e.g., the phase-change material 20) is any material that exhibits variable electrical resistivity that is dependent on crystallinity. As an example, the phase-change material 20 can be a chalcogenide material, such as germanium telluride (GeTe), germanium antimony telluride (GeSbTe), germanium selenium telluride (GeSeTe), or any of a variety of similar materials. The phase-change material 20 can thus be set to a crystalline state to set the switch portion 16, and thus the phase-change material switch 10, to the conducting state, or can be set to an amorphous state to set the switch portion 16, and thus the phase-change material switch 10, to the blocking state.

The actuation portion 18 can be configured to receive a control signal CTRL to switch the phase-change material 20 between the crystalline state and the amorphous state. The actuation portion 18 can include, for example, a metal or metal alloy material that exhibits resistivity and a substantially high thermal conductivity. For example, the actuation portion 18 can be formed from niobium (Nb), tungsten (W), platinum (Pt), nickel chromium (NiCr), titanium tungsten (TiW), or any of a variety of similar metal or metal-containing alloys. The actuation portion 18 can be arranged substantially proximal to the phase-change material 20 in the switch portion 16, such that heat that is generated in the actuation portion 18 can be thermally conducted to the phase-change material 20 in the switch portion 16. As an example, the actuation portion 18 can be fabricated above the switch portion 16, below the switch portion 16, and/or laterally with respect to the switch portion 16. As another example, the actuation portion 18 could also include a plurality of portions of the metal or metal alloy material that can be distinct or integral with each other and are arranged adjacent to and/or surrounding the switch portion 16 and that are provided the control signal CTRL substantially concurrently. As yet another example, the actuation portion 18 and the switch portion 16 can be separated by a dielectric material (not shown) to substantially prevent electrical connectivity between the actuation portion 18 and the switch portion 16. In addition, the type of dielectric material and the thickness therein can be selected to allow the thermal conductivity from the actuation portion 18 to the switch portion 16, and to allow heat dissipation from the switch portion 16 to an associated substrate (not shown), as described in greater detail herein.

The control signal CTRL can be provided as, for example, a current pulse in one of two states to generate a heat profile in the actuation portion 18 via ohmic (i.e., $I^2R$) heat. As another example, the control signal CTRL can be another type of pulsed signal, such as an optical pulse having sufficient optical energy to heat the actuation portion 18 and/or the switch portion 16 directly. Thus, based on the proximal arrangement of the actuation portion 18 with respect to the switch portion 16, the heat profile can be thermally transferred to the phase-change material 20 in the switch portion 16 to control the state of the switch portion 16. As an example, the control signal CTRL can have pulse characteristics (e.g., amplitude and duration) that can dictate the heat profile. For example, the control signal CTRL can be provided in a first state (e.g., with first pulse characteristics) that can generate a first heat profile in the actuation portion 18, and can be provided in a second state (e.g., with second pulse characteristics) that can generate a second heat profile in the actuation portion 18. The first heat profile can correspond to setting the phase-change material 20 to the crystalline state, and thus setting the switch portion 16 to the conducting state, and the second heat profile can correspond to setting the phase-change material 20 to the amorphous state, and thus setting the switch portion 16 to the blocking state. The operation of the state change of the phase-change material between the conducting state and the blocking state is described in greater detail in U.S. patent application Ser. No. 13/803,385 entitled "Phase-Change Material Reconfigurable Circuits", which is incorporated herein by reference in its entirety.

Figure 2:
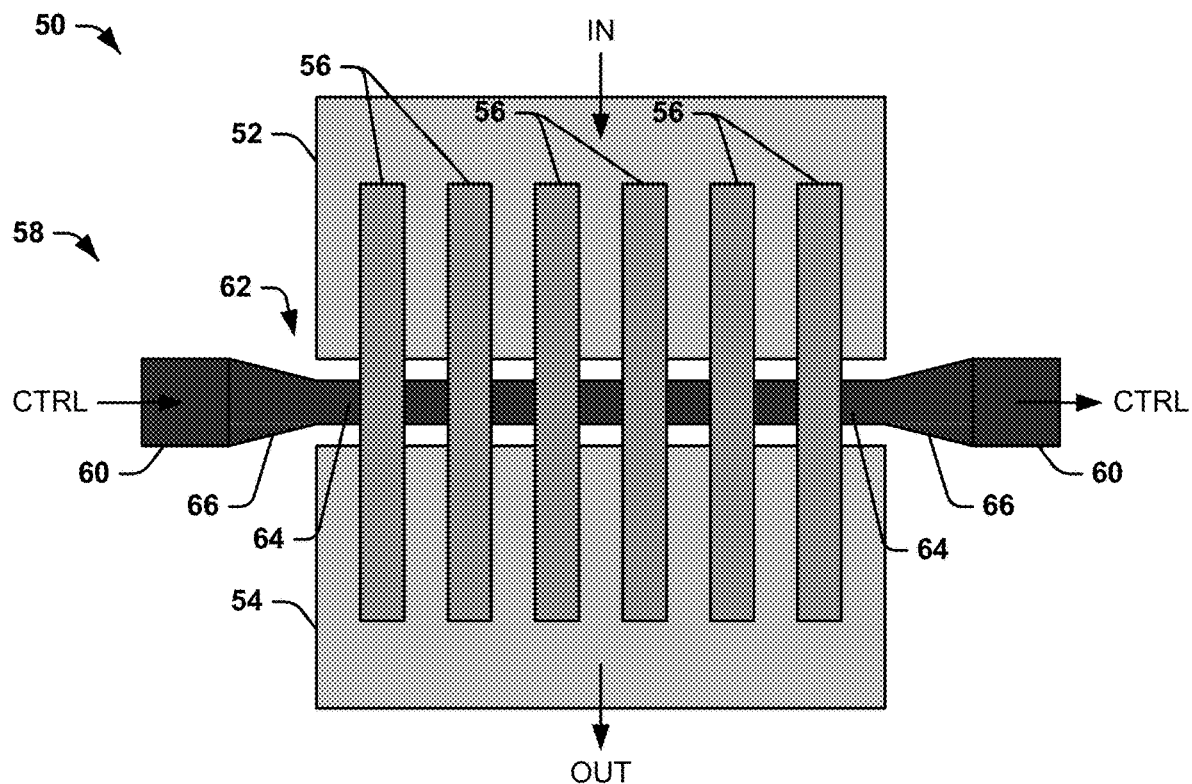
FIG. 2 illustrates an example diagram of a phase-change material switch.

FIG. 2 illustrates an example diagram of a phase-change material switch 50. The phase-change material switch 50 can correspond to the phase-change material switch 50 in the example of FIG. 1. Therefore, reference is to be made to the example of FIG. 1 in the following description of the example of FIG. 2.

The phase-change material switch 50 includes an input terminal 52 that receives the input signal IN, and includes an output terminal 54 that can provide the input signal IN as the output signal OUT in a conducting state of the phase-change material switch 50, such that the phase-change material switch 50 acts substantially as a short-circuit. Additionally, the input signal IN can be blocked from being provided as the output signal OUT in a blocking state of the phase-change material switch 50, such that the phase-change material switch 50 acts substantially as an open-circuit.

The phase-change material switch 50 includes a plurality of longitudinal strips 56 of a phase-change material that can collectively correspond to the switch portion 16 in the example of FIG. 1. For example, the longitudinal strips 56 can be formed from a chalcogenide material, such as GeTe, GeSbTe, GeSeTe, or any of a variety of similar materials. In the example of FIG. 2, the longitudinal strips 56 are arranged in parallel and spaced apart from each other, and are oriented longitudinally to interconnect the input terminal 52 and the output terminal 54. As an example, the longitudinal strips 58 can have a cross-sectional dimension that is between approximately 50 nm to approximately 10 µm. As described herein, the term "cross-sectional dimension" describes at least one cross-sectional dimension, which can include one or more of width, depth, and/or diameter.

The phase-change material switch 50 also includes an actuation portion 58. The actuation portion 58 can include, for example, a metal or metal-containing alloy material that exhibits resistivity and a substantially high thermal conductivity, such as Nb, W, Pt, NiCr, TiW, or any of a variety of similar metal or metal-containing alloys. In the example of FIG. 2, the actuation portion 58 includes a pair of actuation terminals 60 that receive the control signal CTRL. As an example, the control signal CTRL can be provided as a voltage, such that the control signal CTRL is provided as a positive voltage on a first of the pair of actuation terminals 60 and as a return (e.g., ground) on a second of the pair of actuation terminals 60. The actuation portion 58 also includes a conductive strip 62 that conductively interconnects the pair of actuation terminals 60. In the example of FIG. 2, the conductive strip 62 includes a center portion 64 that extends through a gap between the input terminal 52 and the output terminal 54 and beneath a portion of each of the longitudinal strips 56, and is thus in proximity to the longitudinal strips 56. The cross-sectional width of the center portion 64 of the conductive strip 62 may be smaller than, equal to, or wider than the gap between the input terminal 52 and output terminal 54, and the conductive strip 62 may be arranged symmetrically with respect to the gap or may be misaligned in the direction of one of the terminals 52 or 54. In the example of FIG. 2, the conductive strip 62 is demonstrated as substantially centered in the gap with a cross-sectional width in the center portion 64 being smaller than the gap.

The conductive strip 62 also includes tapered portions 66 that couple the center portion 64 to the respective pair of actuation terminals 60. In the example of FIG. 2, the center portion 64 has a cross-sectional dimension that is less than a cross-sectional dimension of the pair of actuation terminals 60, and the tapered portions 66 have a cross-sectional dimension that increases from the cross-sectional dimension of the center portion 64 to a maximum cross-sectional dimension at the coupling to the respective pair of actuation terminals 60, demonstrated in the example of FIG. 2 as being approximately equal in cross-sectional dimension at the coupling to the respective pair of actuation terminals 60. As an example, the maximum cross-sectional dimension of the tapered portions 66 can range from approximately 1.05 times to approximately 5 times the cross-sectional dimension of the central portion 64. For example, the tapering of the tapered sections can begin just beyond the proximity of the conductive strip 62 relative to the phase-change material (e.g., the longitudinal strips 56 in the example of FIG. 2), or the tapering can begin just beyond the respective terminals 52 and 54. The cross-sectional area of the center portion 64 of the conductive strip 62 may also vary in width along the longitudinal dimension of the conductive strip 62, even though it is shown as having non-varying width in the example of FIG. 2.

Based on the arrangement of the longitudinal strips 56 of the phase-change material, the phase-change material switch 50 can achieve improved longevity and more efficient operation than typical phase-change material switches. As an example, the longitudinal strips 56 can be constrained by a dielectric material (not shown) during fabrication, and can also be separated from the conductive strip 62 by a dielectric material. Therefore, in response to the heat profiles provided by the conductive strip 62 in response to the control signal CTRL to change the state of the longitudinal strips 56, the longitudinal strips 56 are subject to less thermal stress than a solid piece of phase-change material overlying the conductive strip 62. Accordingly, the phase-change material switch 50 is less likely to be damaged from breakage of the phase-change material based on the arrangement of the phase-change material as the longitudinal strips 56, and thus may have a greater longevity relative to typical phase-change material switches that incorporate one solid piece of phase-change material. Additionally, because the heat profiles that are provided by the conductive strip 62 can interact with more surface area of the longitudinal strips 56 relative to a solid piece of phase-change material, the longitudinal strips 56 can be subject to greater heat absorption. As a result, the control signal CTRL can be provided at a lesser voltage amplitude to change the state of the phase-change material of the longitudinal strips 56 relative to control signals that are provided to change the state of a single solid piece of phase-change material. Accordingly, the phase-change material switch 50 is more durable and more efficient than typical phase-change material switches.

In addition, based on the inclusion of the tapered portions 66 of the conductive strip 62, the phase-change material switch 50 can achieve an improved longevity than typical phase-change material switches in a different manner. As an example, the tapered portions 66 can provide a greater uniformity of the temperature along the conductive strip 62 due to the control signal CTRL by decreasing the current density in the tapered portions 66 relative to the center portion 64. Therefore, the temperature of the conductive strip 64 can more closely match the temperature of tapered portions 66 during application of the CTRL signal. As a result, heat induced damage to the conductive strip 62 can be substantially mitigated. For example, if the tapered portions 66 were a continuous cross-sectional dimension instead of being tapered, the temperature in those portions may be higher relative to the temperature in the center portion 64 based on the more distant proximity to the phase change material and dielectric material relative to the center portion 64, and could thus melt the conductive strip 62 or cause electro-migration in response to excessive heat. Therefore, the tapered portions 66 can be more robust relative to non-tapered portions that couple a conductive strip to associated electrodes. Accordingly, the phase-change material switch 50 is more durable with respect to the conductive strip 62 relative to typical phase-change material switches.

It is to be understood that the phase-change material switch 50 is not limited to the configuration demonstrated in the example of FIG. 2. As an example, while the phase-change material switch 50 includes both the phase-change material arranged as the longitudinal strips 56 and the tapered portions 66 on the conductive strip 62, it is to be understood that the phase-change material switch 50 could be implemented with either of the features individually. For example, the phase-change material switch 50 could include the longitudinal strips 56 but not the tapered portions 66, or could include the tapered portions 66 and a single solid piece of phase-change material. Additionally, while the phase-change material switch 50 is demonstrated in the example of FIG. 2 as including a total of six longitudinal strips 56, the phase-change material switch 50 could instead include more or less longitudinal strips 56 of equal or differing dimensions. For example, the dimensions of the longitudinal strips 56 and the distance between them could be optimized to balance contact resistance versus material constraint (e.g., durability). Additionally, the cross-sectional width of the center portion 64 can vary along the longitudinal dimension. For example, the center portion 64 can become wider in the region where it is not overlapped by the longitudinal strips 56 of the phase-change material and becoming narrower where it is overlapped by the longitudinal strips 56 of the phase-change material, thus providing the same benefits as the tapered portions 66. Therefore, the phase-change material switch 50 can be configured in a variety of ways.

Figure 3:
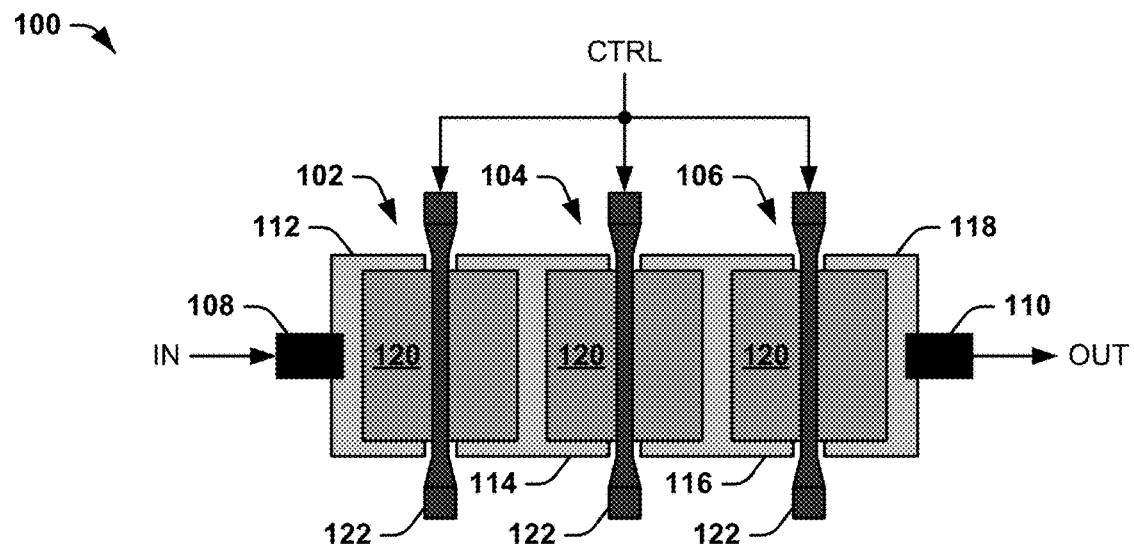
FIG. 3 illustrates an example of a distributed switch system.

FIG. 3 illustrates an example of a distributed switch system 100. The distributed switch system 100 can be implemented in any of a variety of applications that require one or more switches that can be opened or closed to pass or block a signal. For example, the distributed switch system 100 can be implemented in logic circuit and computing applications, radio-frequency (RF) signal switching in front-end receiver systems or transmitter systems, such as an RF field-programmable gate array (FPGA).

The distributed switch system 100 includes a plurality of phase-change material switches, demonstrated in the example of FIG. 3 as a first phase-change material switch 102, a second phase-change material switch 104, and a third phase-change material switch 106 arranged in series between an input signal line 108 that receives an input signal IN and an output signal line 110 that provides an output signal OUT. The distributed switch system 100 includes a first terminal 112, a second terminal 114, a third terminal 116, and a fourth terminal 118 on which the input signal IN can propagate to provide the output signal OUT in a conducting state of the phase-change material switches 102, 104, and 106. In the example of FIG. 3, the first terminal 112 and the second terminal 114 are associated with the first phase-change material switch 102, the second terminal 114 and the third terminal 116 are associated with the second phase-change material switch 104, and the third terminal 116 and the fourth terminal 118 are associated with the third phase-change material switch 106. Therefore, the second terminal 114 is shared between the first and second phase-change material switches 102 and 104, and the third terminal 116 is shared between the second and third phase-change material switches 104 and 106.

Each of the phase-change material switches 102, 104, and 106 includes a switch portion and an actuation portion, demonstrated in the example of FIG. 3 as a phase-change material 120 and a conductive strip 122, respectively. In the example of FIG. 3, the conductive strip 122 is demonstrated as on the opposite side of the phase-change material 120 as is demonstrated in the example of FIG. 2. However, it is to be understood that the conductive strip 122 can be located on either side or both sides of the phase-change material 120. A control signal CTRL is provided to the conductive strip 122 of each of the phase-change material switches 102, 104, and 106 to switch the phase-change material 120 of each of the phase-change material switches 102, 104, and 106 between the crystalline state and the amorphous state, similar to as described previously. Therefore, in response to the phase-change material 120 of each of the phase-change material switches 102, 104, and 106 being set to a crystalline state, the distributed switch system 100 can be set to the conducting state to provide the input signal IN through the distributed switch system 100 as the output signal OUT. Similarly, in response to the phase-change material 120 of each of the phase-change material switches 102, 104, and 106 being set to an amorphous state, the distributed switch system 100 can be set to the blocking state to prevent the input signal IN from being provided through the distributed switch system 100 as the output signal OUT.

The distributed switch system 100 therefore provides a different manner of implementing phase-material switching based on a series-connection of the phase-change material switches 102, 104, and 106. By implementing the distributed switch system 100 over the phase-change material switch 50 in the example of FIG. 2, the distributed switch system 100 provides a greater breakdown threshold voltage (e.g., three times greater relative to the phase-change material switch 50) of the input signal IN, such that the distributed switch system 100 can be implemented for switching applications at higher voltages of the input signal IN. In addition, the distributed switch system 100 provides a better off-state capacitance (e.g., three times better) relative to the phase-change material switch 50.

Figure 4:
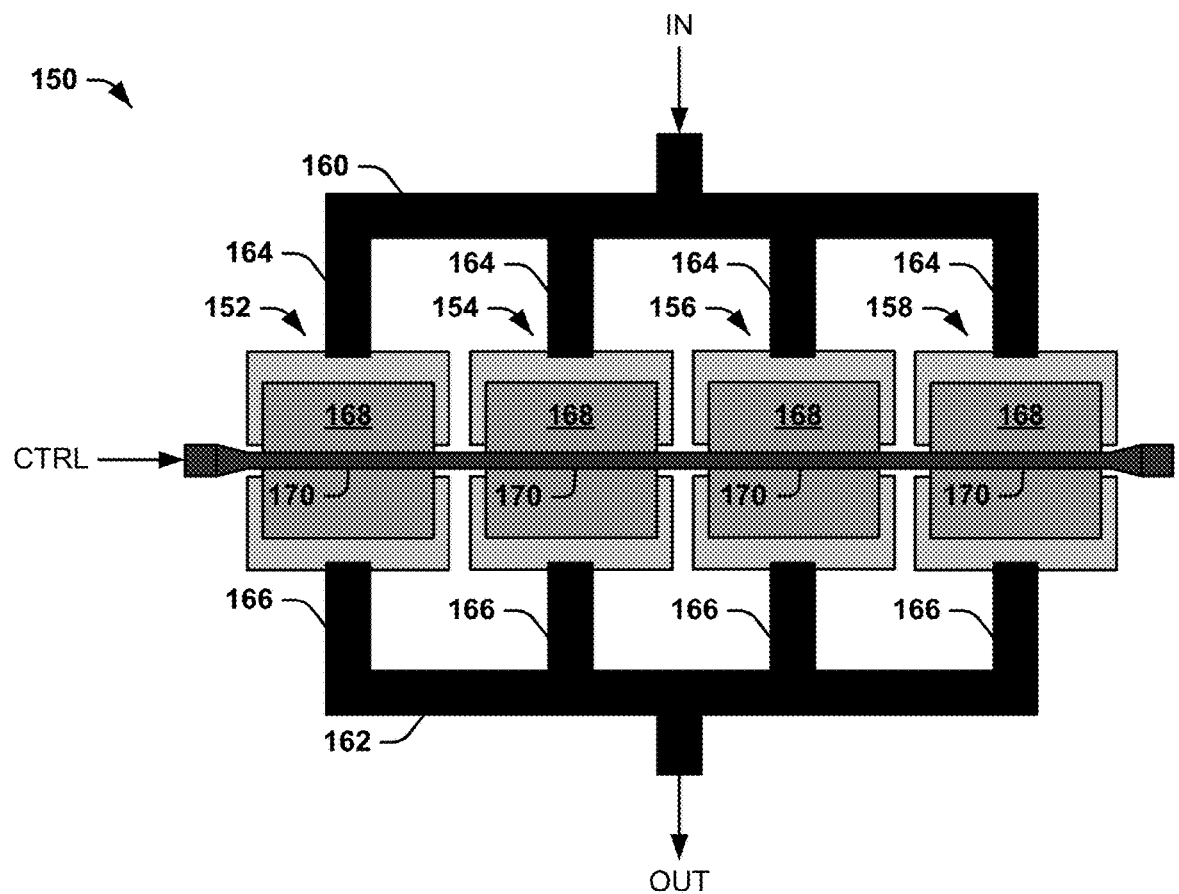
FIG. 4 illustrates another example of a distributed switch system.

FIG. 4 illustrates another example of a distributed switch system 150. Similar to the distributed switch system 100 in the example of FIG. 3, the distributed switch system 150 can be implemented in any of a variety of applications that require one or more switches that can be opened or closed to pass or block a signal.

The distributed switch system 150 includes a plurality of phase-change material switches, demonstrated in the example of FIG. 4 as a first phase-change material switch 152, a second phase-change material switch 154, a third phase-change material switch 156, and a fourth phase-change material switch 158 arranged in parallel between an input signal line 160 that receives an input signal IN and an output signal line 162 that provides an output signal OUT. In the example of FIG. 4, the input signal line 160 and the output signal line 162 are branched, such that the input signal IN is provided to each of the parallel-connected phase-change material switches 152, 154, 156, and 158 and the output signal OUT is provided from each of the parallel-connected phase-change material switches 152, 154, 156, and 158. Each of the parallel-connected phase-change material switches 152, 154, 156, and 158 includes a first terminal 164 that is coupled to the input signal line 160 and a second terminal 166 that is coupled to the output signal line 162.

Each of the phase-change material switches 152, 154, 156, and 158 includes a switch portion and an actuation portion, demonstrated in the example of FIG. 4 as a phase-change material 168 and a conductive strip 170, respectively. In the example of FIG. 4, the conductive strip 170 is demonstrated as on the opposite side of the phase-change material 168 as is demonstrated in the example of FIG. 2. However, it is to be understood that the conductive strip 170 can be located on either side or both sides of the phase-change material 168. A control signal CTRL is provided to the conductive strip 170 of each of the phase-change material switches 152, 154, 156, and 158 to switch the phase-change material 168 of each of the phase-change material switches 152, 154, 156, and 158 between the crystalline state and the amorphous state, similar to as described previously. Therefore, in response to the phase-change material 168 of each of the phase-change material switches 152, 154, 156, and 158 being set to a crystalline state, the distributed switch system 150 can be set to the conducting state to provide the input signal IN through the distributed switch system 150 as the output signal OUT. Similarly, in response to the phase-change material 168 of each of the phase-change material switches 152, 154, 156, and 158 being set to an amorphous state, the distributed switch system 150 can be set to the blocking state to prevent the input signal IN from being provided through the distributed switch system 150 as the output signal OUT.

The distributed switch system 150 therefore provides a different manner of implementing phase-material switching based on a parallel-connection of the phase-change material switches 152, 154, 156, and 158. By implementing the distributed switch system 150 over the phase-change material switch 50 in the example of FIG. 2, the distributed switch system 150 provides an improved on-state resistance (e.g., one quarter the on-state resistance relative to the phase-change material switch 50) relative to the phase-change material switch 50, while maintaining approximately the same breakdown threshold voltage relative to the phase-change material switch 50.

Figure 5:
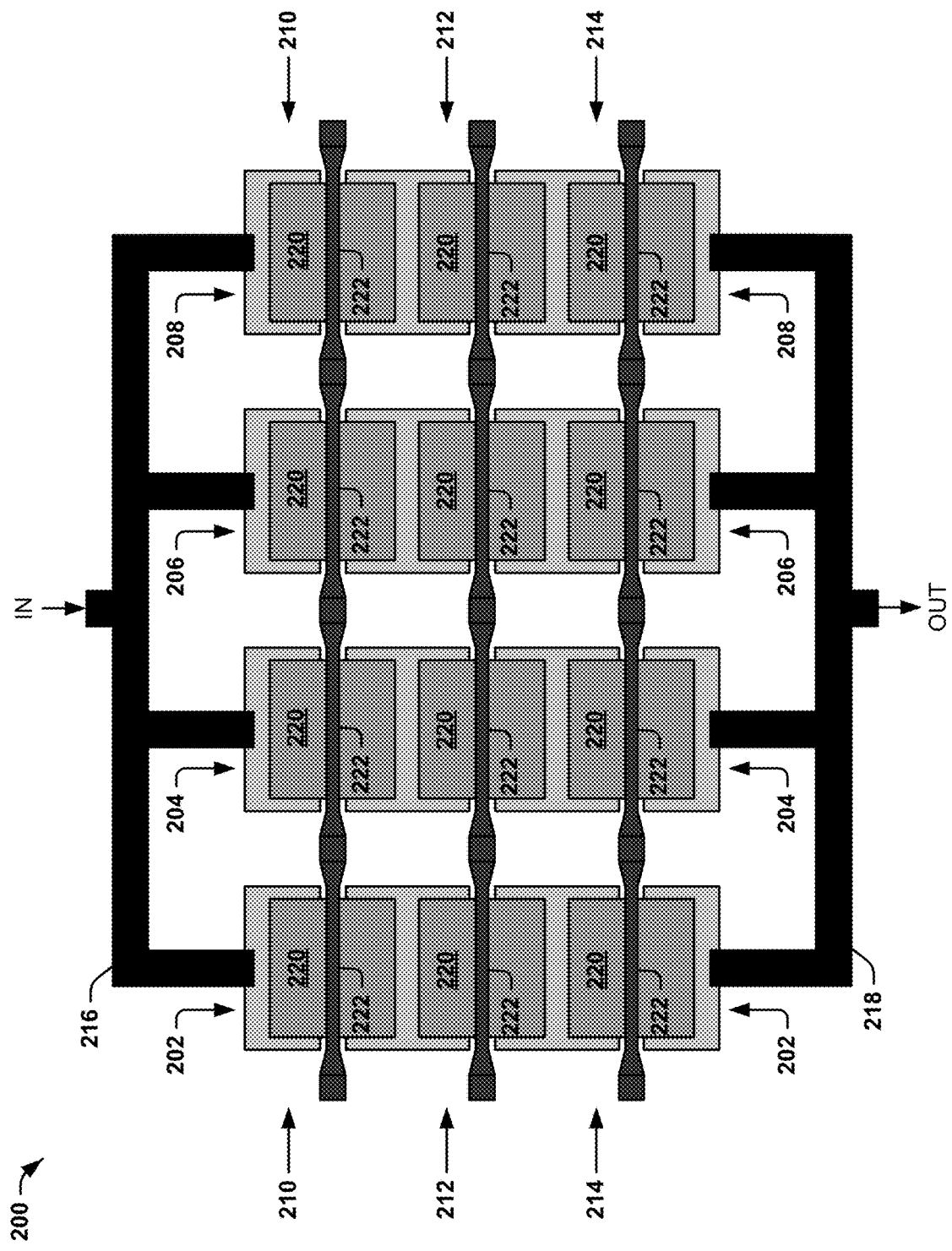
FIG. 5 illustrates yet another example of a distributed switch system.

FIG. 5 illustrates yet another example of a distributed switch system 200. Similar to the distributed switch system 100 in the example of FIG. 3 and the distributed switch system 150 in the example of FIG. 4, the distributed switch system 200 can be implemented in any of a variety of applications that require one or more switches that can be opened or closed to pass or block a signal.

The distributed switch system 200 includes a plurality of phase-change material switches, demonstrated in the example of FIG. 5 as four parallel sets of series-connected phase-change material switches. In the example of FIG. 5, the phase-change material switches are demonstrated as a first set of phase-change material switches 202, a second set of phase-change material switches 204, a third set of phase-change material switches 206, and a fourth set of phase-change material switches 208 that are each coupled in series and which are arranged in parallel in a first row 210, a second row 212, and a third row 214. The sets of phase-change material switches 202, 204, 206, and 208 are each arranged in series between an input signal line 216 that receives an input signal IN and an output signal line 218 that provides an output signal OUT. In the example of FIG. 5, the input signal line 216 and the output signal line 218 are branched, such that the input signal IN is provided to each of the parallel-connected phase-change material switches in the first row 210 and the output signal OUT is provided from each of the parallel-connected phase-change material switches in the third row 214. Therefore, the distributed switch system 200 is demonstrated as a combination of the distributed switch system 100 in the example of FIG. 3 and the distributed switch system 150 in the example of FIG. 4.

Each of the phase-change material switches in each of the sets 202, 204, 206, and 208 includes a switch portion and an actuation portion, demonstrated in the example of FIG. 5 as a phase-change material 220 and a conductive strip 222, respectively. In the example of FIG. 5, the conductive strips 222 are demonstrated as on the opposite side of the phase-change material 220 as is demonstrated in the example of FIG. 2. However, it is to be understood that the conductive strips 222 can be located on either side or both sides of the phase-change material 220. The conductive strip 222 of each phase-change material switch in the rows 210, 212, and 214 are conductively coupled. A control signal CTRL can be provided to the conductive strip 222 of each of the phase-change material switches in the respective rows 210, 212, and 214 to switch the phase-change material 222 of each of the phase-change material switches in the respective rows 210, 212, and 214 between the crystalline state and the amorphous state, similar to as described previously. Therefore, in response to the phase-change material 220 of each of the phase-change material switches in each of the sets 202, 204, 206, and 208 being set to a crystalline state, the distributed switch system 200 can be set to the conducting state to provide the input signal IN through the distributed switch system 200 as the output signal OUT. Similarly, in response to the phase-change material 222 of each of the phase-change material switches in each of the sets 202, 204, 206, and 208 being set to an amorphous state, the distributed switch system 200 can be set to the blocking state to prevent the input signal IN from being provided through the distributed switch system 200 as the output signal OUT. The manner in which the control signal CTRL can be provided through the conductive strips 222 of the phase-change material switches of the distributed switch system 200 can depend on the manner of conductive coupling of the conductive strips 222 between the respective rows 210, 212, and 214 of the phase-change material switches.

Figure 6:
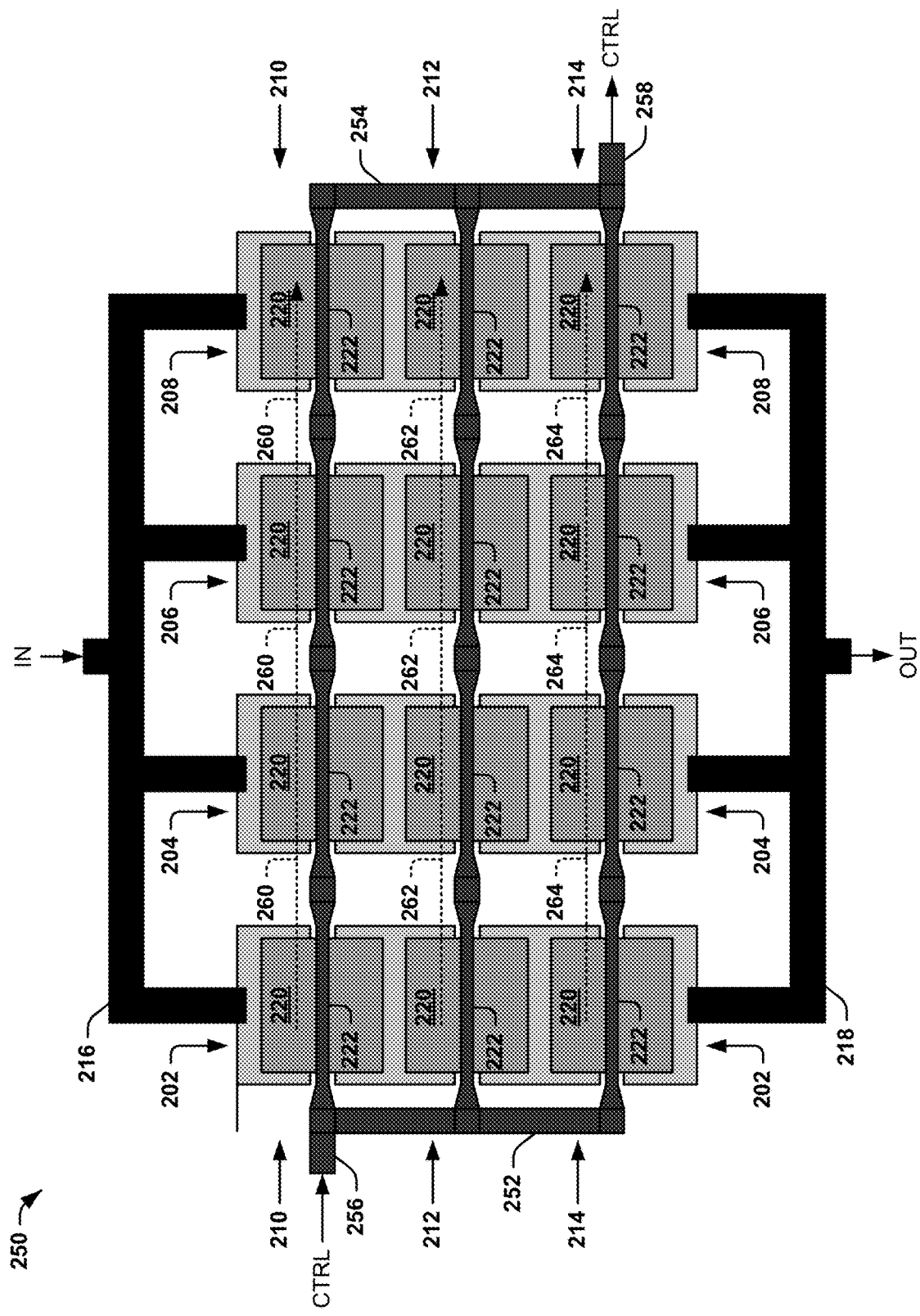
FIG. 6 illustrates an example of a first configuration of the distributed switch system of FIG. 5.

FIG. 6 illustrates an example of a first configuration 250 of the distributed switch system of FIG. 5. The first configuration 250 is a first example of an implementation of the distributed switch system 200 in the example of FIG. 5. Therefore, like reference numbers are used in the description of the first configuration 250 of the distributed switch system 200 as provided in the example of FIG. 5.

In the first configuration 250, the conductive strips 222 of each of the rows 210, 212, and 214 of the phase-change material switches are conductively coupled by a first conductive coupling 252 at a first control terminal 256, and are also conductively coupled by a second conductive coupling 254 at a second control terminal 258. As a result, the current of the control signal CTRL flows both in series through the conductive strips 222 of each of the sets of phase-change material switches 202, 204, 206, and 208 and in parallel through the conductive strips 222 along each of the rows 210, 212, and 214. In the example of FIG. 6, the current flow of the control signal CTRL is demonstrated in a first dotted line 260 through the first row 210, in a second dotted line 262 through the second row 212, and in a third dotted line 264 through the third row 214. Therefore, the current of the control signal CTRL flows in both series and parallel through the distributed switch system 200 in the first configuration 250. Therefore, the distributed switch system 200 in the first configuration 250 can exhibit switching characteristics as follows:

First Configuration 250 (FIG. 6):

Power of the Control Signal CTRL to Switch the
State: $P*N*M$      Equation 1

Total Resistance between Control Terminals 256 and
258: $R*M/N$      Equation 2

Voltage of the Control Signal CTRL to Switch:
$M*\mathrm{SQRT}(P*R)$      Equation 3

Current of the Control Signal CTRL to Switch:
$N*M*\mathrm{SQRT}(P*R)/R$      Equation 4

Wherein:
P=Power required to switch a single phase-change material switch;
N=The number of phase-change material switches in a given one of the sets 202, 204, 206, and 208;
M=The number of phase-change material switches in a given one of the rows 210, 212, and 214;
R=A resistance of a conductive strip of a given one phase-change material switch.

Therefore, the first configuration 250 can provide one example of a manner of implementing phase-material switching based on a combination of series and parallel-connection of the phase-change material switches (e.g., the phase-change material switch 50 in the example of FIG. 2).

Figure 7:
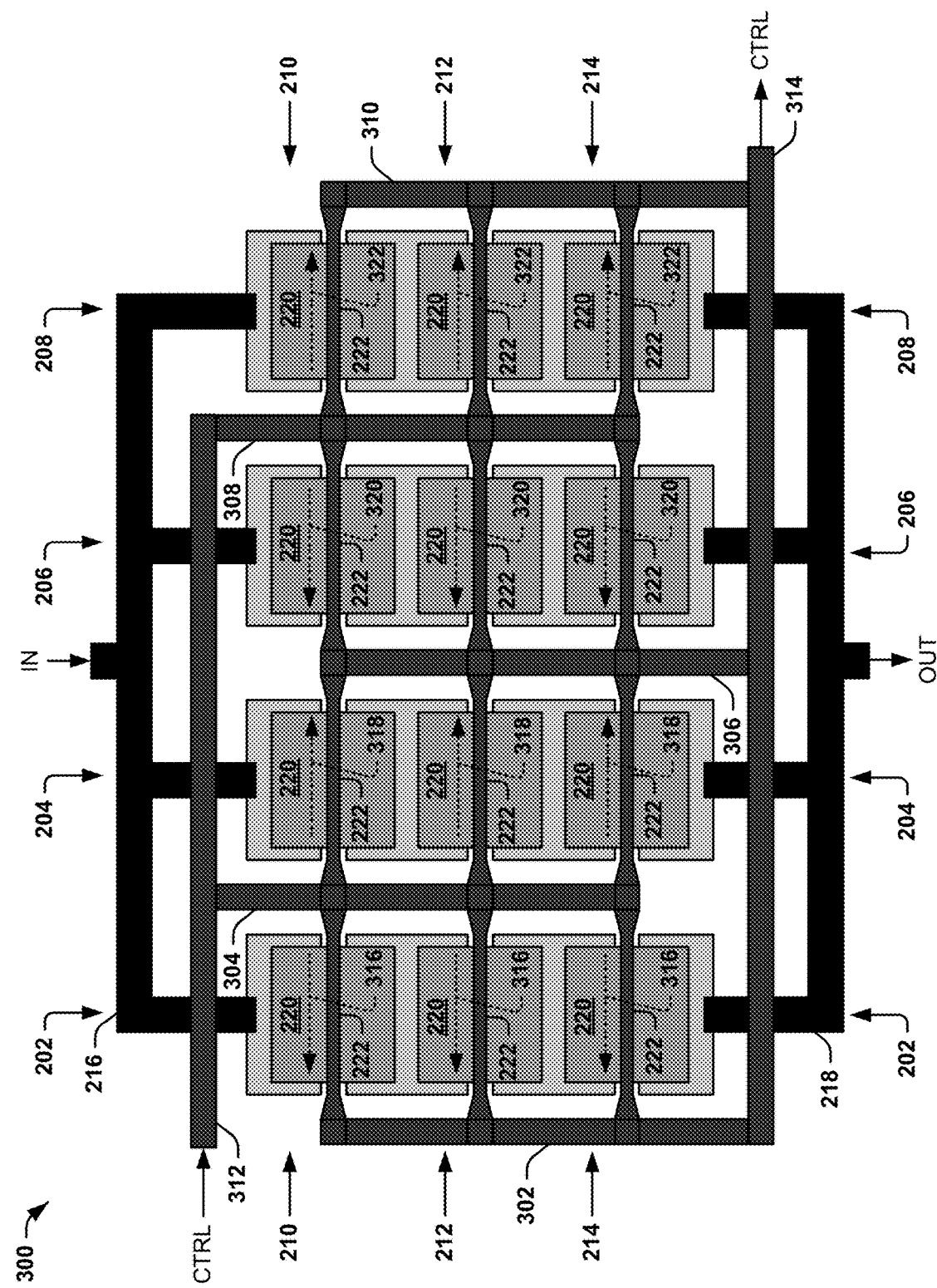
FIG. 7 illustrates an example of a second configuration of the distributed switch system of FIG. 5.

FIG. 7 illustrates an example of a second configuration 300 of the distributed switch system of FIG. 5. The second configuration 300 is a first example of an implementation of the distributed switch system 200 in the example of FIG. 5. Therefore, like reference numbers are used in the description of the second configuration 300 of the distributed switch system 200 as provided in the example of FIG. 5.

In the second configuration 300, the conductive strips 222 of each of the rows 210, 212, and 214 of the phase-change material switches are conductively coupled between each of the sets 202, 204, 206, and 208. As demonstrated in the example of FIG. 7, a first conductive coupling 302 couples the conductive strips 222 of the first set 202 and a second conductive coupling 304 couples the conductive strips 222 of both the first set 202 and the second set 204. A third conductive coupling 306 couples the conductive strips 222 of both the second set 204 and the third set 206 and a fourth conductive coupling 308 couples the conductive strips 222 of both the third set 206 and the fourth set 208, and a fifth conductive coupling 310 couples the conductive strips 222 of the fourth set 208. The second and fourth conductive couplings 304 and 308 are coupled to a first control terminal 312, while the first, third, and fifth conductive couplings 302, 306, and 310 are coupled to a second control terminal 314.

As a result, the current of the control signal CTRL flows in parallel through all of the conductive strips 222 through only a single conductive strip 222 between each of the conductive couplings 302, 304, 306, 308, and 310. In the example of FIG. 7, the current flow of the control signal CTRL is demonstrated in dotted lines 316 through each of the conductive strips 222 in the first set 202, in dotted lines 318 through each of the conductive strips 222 in the second set 204, in dotted lines 320 through each of the conductive strips 222 in the third set 206, and in dotted lines 322 through each of the conductive strips 222 in the fourth set 208. Therefore, the current of the control signal CTRL flows in parallel only through the distributed switch system 200 in the second configuration 300. Therefore, the distributed switch system 200 in the second configuration 300 can exhibit switching characteristics as follows:

Second Configuration 300 (FIG. 7):

Power of the Control Signal CTRL to Switch the
State: $P*N*M$      Equation 5

Total Resistance between Control Terminals 312 and
314: $R/(M*N)$      Equation 6

Voltage of the Control Signal CTRL to Switch:
$\mathrm{SQRT}(P*R)$      Equation 7

Current of the Control Signal CTRL to Switch:
$N*M*\mathrm{SQRT}(P*R)/R$      Equation 8

Therefore, the second configuration 300 can provide another example of a manner of implementing phase-material switching based on a combination of series and parallel-connection of the phase-change material switches (e.g., the phase-change material switch 50 in the example of FIG. 2). The second configuration 300 thus demonstrates a lower switching voltage of the control signal, and a higher switching current of the control signal CTRL relative to the first configuration 250.

Figure 8:
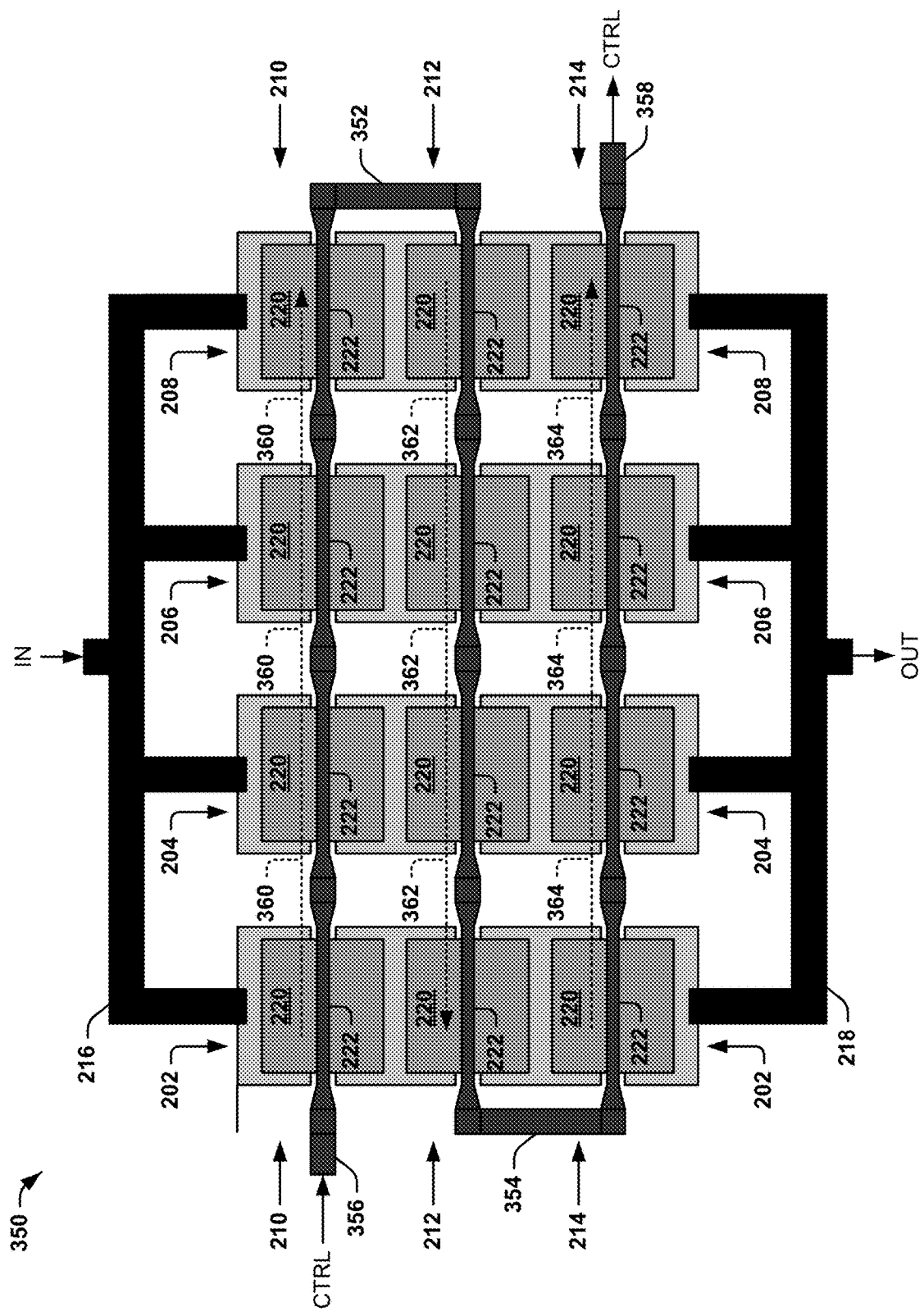
FIG. 8 illustrates an example of a third configuration of the distributed switch system of FIG. 5.

FIG. 8 illustrates an example of a third configuration of the distributed switch system of FIG. 5. The third configuration 350 is a third example of an implementation of the distributed switch system 200 in the example of FIG. 5. Therefore, like reference numbers are used in the description of the third configuration 350 of the distributed switch system 200 as provided in the example of FIG. 5.

In the third configuration 350, the conductive strips 222 of the row 210 and the row 212 of the phase-change material switches are conductively coupled by a first conductive coupling 352. The conductive strips 222 of the row 212 and the row 214 are coupled by a second conductive coupling 354. A first control terminal 356 is coupled to the conductive strips 222 of the row 210 opposite the first conductive coupling 352, and a second control terminal 358 is coupled to the conductive strips 222 of the row 214 opposite the second conductive coupling 354.

As a result, the current of the control signal CTRL flows in series through the conductive strips 222 all of the phase-change material switches in each of the sets 202, 204, 206, and 208 and in each of the rows 210, 212, and 214. In the example of FIG. 8, the current flow of the control signal CTRL is demonstrated in a dotted line 360 through the first row 210, in a second dotted line 362 through the second row 212 in the opposite direction as the dotted line 360, and in a third dotted line 364 through the third row 214 in the opposite direction as the dotted line 362. Therefore, the current of the control signal CTRL flows in series only through the distributed switch system 200 in the third configuration 350. Therefore, the distributed switch system 200 in the third configuration 350 can exhibit switching characteristics as follows:

Third Configuration 350 (FIG. 8):

Power of the Control Signal CTRL to Switch the
State: $P*N*M$             Equation 9

Total Resistance between Control Terminals 356 and
358: $R*M*N$             Equation 10

Voltage of the Control Signal CTRL to Switch:
$N*M*SQRT(P*R)$             Equation 11

Current of the Control Signal CTRL to Switch:
$SQRT(P*R)/R$             Equation 12

Therefore, the third configuration 350 can provide yet another example of a manner of implementing phase-material switching based on a combination of series and parallel-connection of the phase-change material switches (e.g., the phase-change material switch 50 in the example of FIG. 2). The third configuration 350 thus demonstrates a higher switching voltage of the control signal, and a lower switching current of the control signal CTRL relative to the first configuration 250.

It is to be understood that the distributed switch systems 100 and 150 are not intended to be limited to the examples of FIGS. 3 and 4, and the distributed switch system 200 is not intended to be limited to the examples of FIGS. 5-8. As an example, the distributed switch system 100 could include more phase-change material switches in series, the distributed switch system 150 could include more phase-change material switches in parallel, and the distributed switch system 200 could include additional phase-change material switches in each of the sets and rows. Additionally, it is to be understood that the distributed switch system 200 could include more than one control signal CTRL that is configured to control the phase-change material switches or a group of the phase-change material switches individually of other phase-change material switches in the distributed switch system 200. As an example, the multiple control signals CTRL could provide individual control of multiple input signals IN, or could provide switching of the input signal IN with different switching characteristics. Furthermore, the distributed switch systems 100, 150, and 200 demonstrate single, solid pieces of phase-change material in each of the phase-change material switches, and tapered portions in each of the conductive strips. However, it is to be understood that one or more of the phase-change material switches can include the longitudinal strips (e.g., substantially similar to the longitudinal strips 56 in the example of FIG. 2), and/or can include non-tapered conductive strips, in each of the distributed switch systems 100, 150, and 200. Accordingly, the distributed switch systems 100, 150, and 200 can be implemented in a variety of ways.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A distributed switch system comprising a plurality of phase-change material switches that are arranged in one of parallel, series, and a combination of parallel and series with respect to each other, the distributed switch system being responsive to a single control signal, the single control signal having a first state and a second state, each of the plurality of phase-change material switches comprising:
   a first terminal receiving an input signal;
   a second terminal;
   an actuation portion emitting a first heat profile upon receiving the single control signal in the first state and a second heat profile upon receiving the single control signal in the second state, wherein the actuation portion of each of the plurality of phase-change material switches receives the single control signal substantially concurrently; and
   a switch portion comprising a phase-change material in proximity with the actuation portion, the phase-change material being selectable between a conducting state in response to the first heat profile to conduct the input signal from the first terminal to the second terminal and a blocking state in response to the second heat profile to substantially block the input signal from the first terminal to the second terminal.

2. The distributed switch system of claim 1, wherein the plurality of phase-change material switches are arranged in one of parallel and a combination of parallel and series, the distributed switch system further comprising a signal line on which the input signal propagates, wherein the input signal is split between the first terminal of each one of the plurality of phase-change material switches that are coupled to the signal line in parallel.

3. The distributed switch system of claim 1, wherein the phase-change material of each of the plurality of phase-change material switches is selectable between the conducting state and the blocking state in response to the first and second heat profiles, respectively, based on the control signal that is provided to the actuation portion of each of the plurality of phase-change material switches.

4. The distributed switch system of claim 1, wherein the phase-change material of each of the plurality of phase-change material switches is arranged as a plurality of longitudinal strips that are arranged parallel and spaced apart from each other and extend longitudinally to interconnect the first terminal and the second terminal and that are each in proximity with the actuation portion.

5. The distributed switch system of claim 1, wherein the actuation portion comprises:
   a pair of actuation terminals receiving the control signal; and
   a conductive strip that extends between the pair of actuation terminals and comprises a central portion having a cross-sectional dimension that is less than a dimension of the pair of actuation terminals and a pair of tapered portions that each have a cross-sectional dimension that increases from the cross-sectional dimension of the central portion to a maximum cross-sectional dimension at a respective coupling to the pair of actuation terminals.

6. A distributed switch system comprising a plurality of phase-change material switches that are arranged in one of parallel, series, and a combination of parallel and series with respect to each other, each of the plurality of phase-change material switches comprising:
   a first terminal receiving a single input signal;
   a second terminal;
   an actuation portion receiving a control signal in one of a first state to emit a first heat profile and a second state to emit a second heat profile; and
   a switch portion comprising a phase-change material in proximity with the actuation portion, the phase-change material being selectable between a conducting state in response to the first heat profile to conduct the single input signal from the first terminal to the second terminal and a blocking state in response to the second heat profile to substantially block the single input signal from the first terminal to the second terminal;
   wherein the actuation portion of each of the plurality of phase-change material switches receives the control signal substantially concurrently.

7. The distributed switch system of claim 6, wherein the distributed switch system further comprises a signal line on which the single input signal propagates, wherein the single input signal is split between the first terminal of each one of the plurality of phase-change material switches that are coupled to the signal line in parallel.

8. The distributed switch system of claim 6, wherein the phase-change material of each of the plurality of phase-change material switches is selectable between the conducting state and the blocking state in response to the first and second heat profiles, respectively, based on the control signal that is provided to the actuation portion of each of the plurality of phase-change material switches.

9. The distributed switch system of claim 6, wherein the phase-change material of each of the plurality of phase-change material switches is arranged as a plurality of longitudinal strips that are arranged parallel and spaced apart from each other and extend longitudinally to interconnect the first terminal and the second terminal and that are each in proximity with the actuation portion.

10. The distributed switch system of claim 6, wherein the actuation portion comprises:
    a pair of actuation terminals receiving the control signal; and
    a conductive strip that extends between the pair of actuation terminals and comprises a central portion having a cross-sectional dimension that is less than a dimension of the pair of actuation terminals and a pair of tapered portions that each have a cross-sectional dimension that increases from the cross-sectional dimension of the central portion to a maximum cross-sectional dimension at a respective coupling to the pair of actuation terminals.

11. The distributed switch system of claim 1, being adapted to transmit an RF signal as the input signal.

12. The distributed switch system of claim 1, wherein each of the plurality of phase-change material switches is arranged to reduce thermal stress exerted on the switch portion.

13. The distributed switch system of claim 6, being adapted to transmit an RF signal as the input signal.

14. The distributed switch system of claim 6, wherein each of the plurality of phase-change material switches is arranged to reduce thermal stress exerted on the switch portion.

* * * * *